(12) United States Patent
Lee et al.

(10) Patent No.: US 11,404,472 B2
(45) Date of Patent: Aug. 2, 2022

(54) DISPLAY MODULE AND DISPLAY APPARATUS INCLUDING LIGHT BLOCKING LAYER WITH OPENINGS HAVING REGULAR INTERVALS THEREBETWEEN

(71) Applicant: Samsung Electronics Co., Ltd., Suwon-si (KR)

(72) Inventors: Yoonsuk Lee, Suwon-si (KR); Doyoung Kwag, Suwon-si (KR); Eunhye Kim, Suwon-si (KR); Sangmoo Park, Suwon-si (KR); Minsub Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 16/561,161

(22) Filed: Sep. 5, 2019

(65) Prior Publication Data

US 2020/0083283 A1 Mar. 12, 2020

(30) Foreign Application Priority Data

Sep. 7, 2018 (KR) .................. 10-2018-0106790

(51) Int. Cl.
*H01L 27/15* (2006.01)
*G02F 1/135* (2006.01)
*H01L 27/32* (2006.01)

(52) U.S. Cl.
CPC ............ *H01L 27/156* (2013.01); *G02F 1/135* (2013.01); *H01L 27/3218* (2013.01); *G02F 1/1351* (2021.01)

(58) Field of Classification Search
CPC ... H01L 27/156; H01L 27/3218; G02F 1/135; G02F 1/1351
USPC .......................................................... 257/89
See application file for complete search history.

(56) References Cited

U.S. PATENT DOCUMENTS

| | | | |
|---|---|---|---|
| 9,557,954 B2 | 1/2017 | Jepsen et al. | |
| 9,935,153 B1 | 4/2018 | Jung et al. | |
| 10,204,962 B2 | 2/2019 | Cha et al. | |
| 2011/0096045 A1 | 4/2011 | Ito et al. | |
| 2015/0194572 A1* | 7/2015 | Kwon | H01L 33/60 257/98 |
| 2017/0345867 A1* | 11/2017 | Chaji | H01L 21/6835 |
| 2018/0012943 A1* | 1/2018 | Ikeda | H01L 27/3246 |
| 2018/0102350 A1* | 4/2018 | Kim | H01L 24/11 |
| 2020/0163233 A1* | 5/2020 | Brackley | H05K 5/0017 |

(Continued)

FOREIGN PATENT DOCUMENTS

| | | |
|---|---|---|
| JP | 2011-90152 A | 5/2011 |
| JP | 6091189 B2 | 3/2017 |

(Continued)

*Primary Examiner* — Xia L Cross
(74) *Attorney, Agent, or Firm* — Sughrue Mion, PLLC

(57) ABSTRACT

A display module includes a substrate, a plurality of LEDs that are disposed on the substrate and irradiate light, and a light blocking layer that covers the plurality of LEDs, and fills intervals among the plurality of LEDs, each interval of the intervals being a distance between two adjacent LEDs of the plurality of LEDs, and wherein the light blocking layer includes a plurality of openings formed such that a top surface of each of the plurality of LEDs is exposed.

18 Claims, 17 Drawing Sheets

(56) References Cited

U.S. PATENT DOCUMENTS

| | | | |
|---|---|---|---|
| 2020/0279979 A1* | 9/2020 | Lee | H01L 27/156 |
| 2021/0183928 A1* | 6/2021 | Hoshi | H01L 27/14625 |

FOREIGN PATENT DOCUMENTS

| | | | |
|---|---|---|---|
| KR | 10-2017-0057512 A | 5/2017 | |
| KR | 10-2018-0051006 A | 5/2018 | |

* cited by examiner

DISPLAY MODULE AND DISPLAY APPARATUS INCLUDING LIGHT BLOCKING LAYER WITH OPENINGS HAVING REGULAR INTERVALS THEREBETWEEN

CROSS-REFERENCE TO RELATED APPLICATION(S)

This application is based on and claims priority under 35 U.S.C. § 119(a) to Korean Patent Application No. 10-2018-0106790, filed on Sep. 7, 2018 in the Korean Intellectual Property Office, the disclosure of which is incorporated by reference herein in its entirety.

BACKGROUND

1. Field

Some embodiments of the disclosure relate to a display module of which contrast ratio and manufacturing efficiency have been improved, and a display apparatus including the same.

2. Description of Related Art

A micro LED is a micro mini inorganic light emitting substance that emits light by itself without a color filter and a backlight. Specifically, a micro LED may refer to a micro mini LED which has a 1/10 length and a 1/100 area of those of a general light emitting diode (LED) chip, and of which width, length, and height are in sizes of between 10 and 100 micrometers (μm).

A micro LED may implement various colors including a white color, through R, G, and B micro LEDs that respectively express a red color, a green color, and a blue color.

Accordingly, it is ideal that each micro LED expressing such R, G, and B colors is disposed on a substrate at regular intervals among micro LEDs, so as to implement uniform luminance of a display through a combination of various colors and a combination of R, G, and B.

However, in a process of disposing micro LEDs on a substrate, disposition errors in micro units may occur in intervals among micro LEDs, and irregular intervals among micro LEDs accompany a problem that uniform luminance of a display cannot be implemented.

SUMMARY

An aspect of embodiments of the disclosure include providing a display module of which contrast ratio and uniformness of luminance have been improved by making LEDs of which arrangement intervals are not regular due to arrangement errors irradiate light at regular intervals, a display apparatus including the same, and a method of manufacturing a display module.

An embodiment of the disclosure for achieving the aforementioned purpose includes, for example, a display module including a substrate, a plurality of LEDs that are disposed on the substrate and irradiate light, and a light blocking layer that covers the plurality of LEDs, and fills an intervals among the plurality of LEDs, wherein the light blocking layer includes a plurality of openings formed such that a top surface of each of the plurality of LEDs is exposed.

The cross section of each of the plurality of openings may be smaller than the cross sections of the top surfaces of the plurality of LEDs.

Also, the cross sections of the plurality of openings may be circles of which diameters are regular, and the intervals among the plurality of openings may be identical.

In addition, each of the plurality of openings may include a light diffusing surface which is formed to be tilted by a specific angle with respect to the top surfaces of the LEDs along the corner of each of the plurality of openings.

Meanwhile, the plurality of LEDs may include a first micro LED emitting a red light, a second micro LED emitting a green light, and a third micro LED emitting a blue light, and the first through third LEDs may constitute a pixel.

The first through third LEDs may be sequentially disposed on the substrate.

Meanwhile, the light blocking layer may be formed on the substrate, and the height of the light blocking layer may be higher than the height of the plurality of LEDs.

In addition, for achieving the aforementioned purpose, an embodiment of the disclosure may provide a display apparatus including a plurality of display modules, and a housing that supports the plurality of display modules to be disposed in parallel on the same plane, wherein each of the plurality of display modules includes a substrate, a plurality of LEDs that are disposed on the substrate and irradiate light, and a light blocking layer that covers the plurality of LEDs, and fills the intervals among the plurality of LEDs, and wherein the light blocking layer includes a plurality of openings formed such that the top surface of each of the plurality of LEDs is exposed.

The light blocking layer may fill the intervals among the plurality of display modules.

Also, the light blocking layer formed in the top portion of each of the plurality of display modules may be formed as an integrated body.

Meanwhile, the plurality of openings may be formed in the form of a grid, and each of the plurality of openings may be formed in a location corresponding to each of the plurality of LEDs.

In addition, for achieving the aforementioned purpose, an embodiment of the disclosure may include a method of manufacturing a display module including the steps of disposing a plurality of LEDs on a substrate, applying a light blocking layer on the plurality of disposed LEDs, and forming a plurality of openings formed at predetermined intervals on the top portion of each of the plurality of LEDs.

The step of forming a plurality of openings may further include the steps of applying a photo resist layer on the top surface of the applied light blocking layer, positioning a mask wherein a through hole is formed in the form of a grid on the top portion of the photo resist layer, exposing light to the top portion of the mask, etching an area wherein the plurality of openings will be formed, and removing the photo resist layer.

Also, the method of manufacturing a display module may further include the step of applying a protective layer on the top surfaces of the plurality of LEDs before applying the light blocking layer.

According to an embodiment of the disclosure, a display module comprises a substrate; a plurality of LEDs that are disposed on the substrate and irradiate light; and a light blocking layer that covers the plurality of LEDs, and fills intervals among the plurality of LEDs, each interval of the intervals being a distance between two adjacent LEDs of the plurality of LEDs, and wherein the light blocking layer includes a plurality of openings formed such that a top surface of each of the plurality of LEDs is exposed.

A cross section of each of the plurality of openings may be smaller than a cross section of the top surface of each of the plurality of LEDs. The cross sections of the plurality of openings may be circles of which diameters are regular, and intervals between centers of adjacent openings of the plurality of openings may be identical. The light blocking layer may include a plurality of light diffusing surfaces, and along a corner of each opening of the plurality of openings may be provided a respective light diffusing surface, of the plurality of light diffusing surfaces, which is tilted at a specific angle with respect to the top surfaces of the plurality of LEDs. The plurality of LEDs may include a first micro LED configured to emit a red light; a second micro LED configured to emit a green light; and a third micro LED configured to emit a blue light, wherein the first through third LEDs constitute a pixel. The first through third LEDs may be sequentially disposed on the substrate. The light blocking layer may be formed on the substrate, and a height of the light blocking layer may be higher than a height of the plurality of LEDs.

In an embodiment of the disclosure, the top surface of each of the plurality of LEDs are exposed through a respective one of the plurality of openings. In an embodiment of the disclosure, a plurality of pixels, each of the plurality of pixels includes a respective three of the plurality of LEDs as sub-pixels, wherein, for each pixel of the plurality of pixels, top surfaces of the sub-pixels of the pixel are together exposed through a respective one of the plurality of openings.

According to an embodiment of the disclosure, a display apparatus comprises a plurality of display modules; an arrangement member that supports the plurality of display modules to be disposed in parallel on a same plane; and a housing that supports the plurality of display modules and the arrangement member. Each of the plurality of display modules includes: a substrate; a plurality of LEDs that are disposed on the substrate and irradiate light; and a light blocking layer that covers the plurality of LEDs, and fills intervals among the plurality of LEDs, each interval of the intervals being a distance between two adjacent LEDs of the plurality of LEDs, and wherein the light blocking layer includes a plurality of openings formed such that a top surface of each of the plurality of LEDs is exposed.

The light blocking layer of a first display module of the plurality of display modules may be formed with the light blocking layer of a second display module of the plurality of display modules, as a combined light blocking layer. The first display module may be adjacent to the second display module with an interval between the first display module and the second display module, and the combined light blocking layer may fill the interval between the first display module and the second display module. Each light blocking layer of the plurality of display modules may be formed together as an integrated body, and the integrated body may be formed in a top portion of the plurality of display modules. Cross sections of the plurality of openings may be circles of which diameters are regular, and intervals between centers of adjacent openings of the plurality of openings of at least one of the plurality of display modules may be identical.

In an embodiment of the disclosure, for each display module of the plurality of display modules, the top surfaces of the plurality of LEDs of the display module are each exposed through a respective one of the plurality of openings of the light blocking layer of the display module. In an embodiment of the disclosure, for each display module of the plurality of display modules, the display module comprises a plurality of pixels, each of the plurality of pixels including a respective three of the plurality of LEDs of the display module as sub-pixels, wherein, for each pixel of the plurality of pixels, top surfaces of the sub-pixels of the pixel are together exposed through a respective one of the plurality of openings of the light blocking layer of the display module.

In an embodiment of the disclosure, an opening of the plurality of openings of the first display module is adjacent to an opening of the plurality of openings of the second display module, and an interval between a center of the opening of the first display module and a center of the opening of the second display module is a same distance as intervals between centers of adjacent openings of the plurality of openings of the first display module and intervals between centers of adjacent openings of the plurality of openings of the second display module.

According to an embodiment of the disclosure, a method of manufacturing a display module comprises disposing a plurality of LEDs on a substrate; applying a light blocking layer on the plurality of LEDs that are disposed; and forming a plurality of openings that expose a top surface of each of the plurality of LEDs.

The forming the plurality of openings may further comprise applying a photo resist layer on a top surface of the light blocking layer that is applied; positioning a mask wherein through holes of the mask are formed in the form of a grid on a top portion of the photo resist layer; exposing light to the top portion of the mask; etching an area wherein the plurality of openings will be formed; and removing the photo resist layer.

The method may further comprise applying a protective layer on the top surfaces of the plurality of LEDs before applying the light blocking layer. The applying the light blocking layer may comprise applying, by using a dispenser, a resin composition constituting the light blocking layer and including a black pigment.

DETAILED DESCRIPTION

Hereinafter, non-limiting example embodiments of the disclosure will be described with reference to the accompanying drawings, for comprehensive understanding of the constitution and the effect of the disclosure. However, it should be noted that the disclosure is not limited to the embodiments described herein, but may be implemented in various forms, and various modifications may be made to the embodiments of the disclosure. The descriptions of the embodiments of the disclosure are provided just to make the descriptions of the disclosure complete, and to make people having ordinary knowledge in the technical field to which the disclosure belongs fully understand the range of the disclosure. Meanwhile, in the accompanying drawings, components were illustrated in more enlarged sizes than their actual sizes for the convenience of description, and the proportion of each component may be exaggerated or reduced.

In case it is described that a component is "on top of" or "contacts" another component, it should be understood that a component may directly contact or be connected with the top portion of another component, but still another component may exist between the components. In contrast, in case it is described that a component is "just on top of" or "directly contacts" another component, it may be understood that still another component does not exist between the components. Other expressions describing relations between components, for instance, expressions such as "between ~" and "directly between ~" may be interpreted in the same manner.

Terms such as "first," "second" and the like may be used to describe various elements, but the terms are not intended to limit the elements. Such terms are used only to distinguish one element from another element. For example, a first element may be called a second element, and a second element may be called a first element in a similar manner, without departing from the scope of protection of the disclosure.

Singular expressions include plural expressions, unless defined obviously differently in the context. Further, terms such as "include" and "have" should be construed as designating that there are such characteristics, numbers, steps, operations, elements, components or a combination thereof described in the specification, and the terms may be interpreted as denoting that one or more of other characteristics, numbers, steps, operations, elements, components or a combination thereof may be added.

Terms used in the embodiments of the disclosure may be interpreted as meanings generally known to those of ordinary skill in the art, unless defined differently in the disclosure.

Hereinafter, the configuration of the display apparatus 1 according to the disclosure will be described with reference to FIG. 1.

Figure 1:
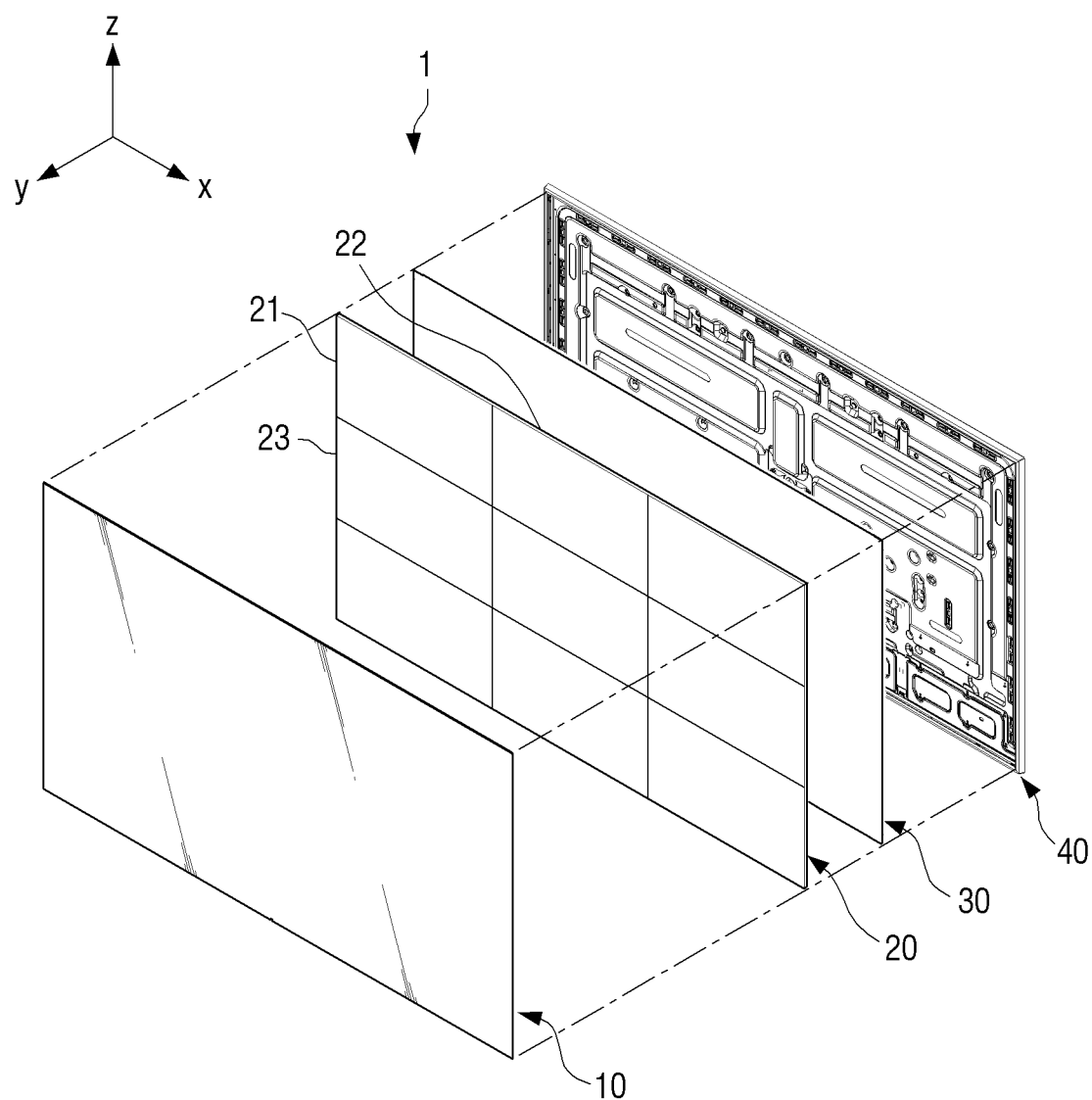
FIG. 1 is an exploded perspective view of a display apparatus according to an embodiment of the disclosure.

FIG. 1 is an exploded perspective view of a display apparatus 1 according to an embodiment of the disclosure.

The display apparatus 1 that will be described below is an apparatus that is capable of processing an image signal received from the outside, and visually displaying a processed image, and it may be implemented as various forms such as a television, a monitor, a portable multimedia apparatus, and a portable communication apparatus, and its form is not limited if it is an apparatus that visually displays an image.

As illustrated in FIG. 1, the display apparatus 1 may include a protection plate 10, a plurality of display modules 20, an arrangement member 30, and a housing 40.

The protection plate 10 may be disposed on the front surface (the Y axis direction) of the display apparatus 1, and may protect the plurality of display modules 20 disposed on the rear side of the protection plate 10 from the outside.

Meanwhile, the protection plate 10 may consist of a glass material formed in a thin thickness, and may consist of various materials depending on needs.

The plurality of display modules 20 may implement light such that an image is displayed at the front (the Y axis direction) according to an image signal input from the outside.

In addition, the plurality of display modules 20 may be disposed to suit the size of a display that each of the display modules 20 manufactured as a module is going to implement, and constitute a display screen.

For example, in case the first through second display modules 21, 22 are disposed in parallel in a horizontal direction (the X axis direction), a display screen may be implemented such that the horizontal direction (the X axis direction) is longer than the vertical direction (the Z axis direction).

Also, in case the first through third display modules 21, 23 are disposed in parallel in a vertical direction (the Z axis direction), a display screen may be implemented such that the vertical direction (the Z axis direction) is longer than the horizontal direction (the X axis direction).

Accordingly, display screens in various sizes and forms may be implemented according to the number and forms of disposing the plurality of display modules 20.

Detailed explanation of the display modules 20 will be made later with reference to FIGS. 2 and 3.

The arrangement member 30 is a plate wherein the plurality of display modules 20 can be disposed, and is disposed on the rear surfaces of the plurality of display modules 20. The arrangement member 30 may be formed as a flat plate, and may be formed in various forms and sizes to suit the forms and the sizes of the plurality of display modules 20.

Accordingly, the arrangement member 30 may support the plurality of display modules 20 such that the plurality of display modules 20 are disposed in parallel on the same plane. Also, the arrangement member 30 may implement the same height among the display modules 20, and thereby implement uniform luminance of a display screen.

The housing 40 may form the exterior of the display apparatus 1, and may be disposed on the rear side of the arrangement member 30, and may stably fix the plurality of display modules 20 and the arrangement member 30.

Also, the housing 40 may stably fix the corner area of the protection plate 10.

Accordingly, the housing 40 may prevent various types of components included in the display apparatus 1 from being exposed to the outside, and thereby protect the various types of components included in the display apparatus 1 from an external shock.

Hereinafter, the detailed configuration and the operation of the display modules 20 will be described with reference to FIGS. 2 and 3.

Figure 2:
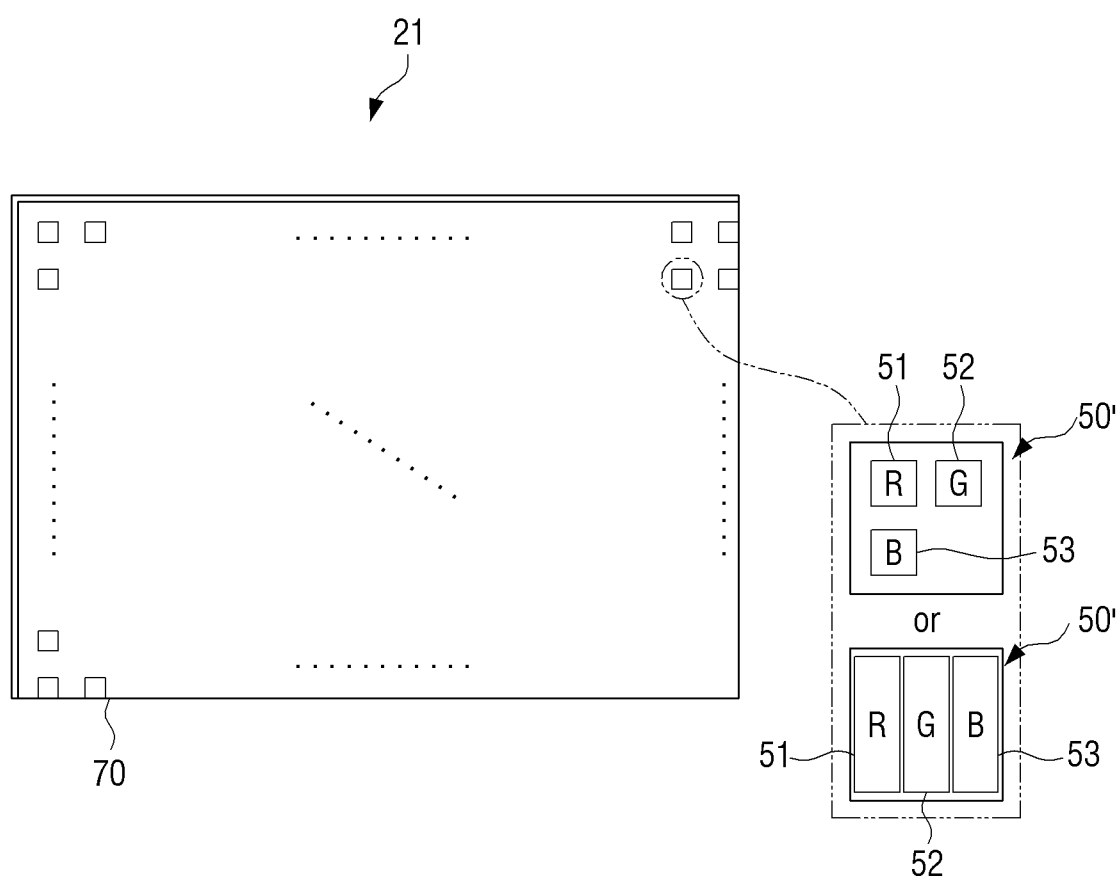
FIG. 2 is a front view illustrating a display module wherein a light blocking layer is not formed.
Figure 3:
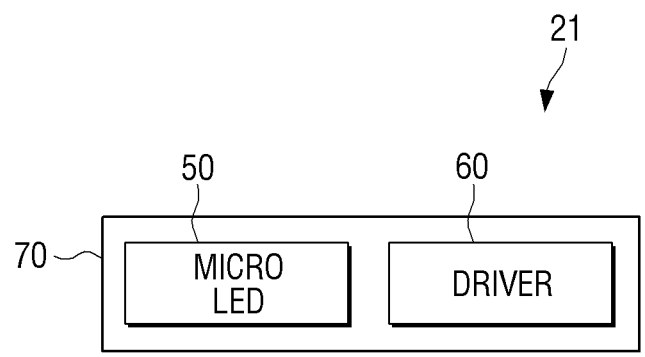
FIG. 3 is a block diagram illustrating an operation of a display module.

FIG. 2 is a front view illustrating a display module 21 wherein a light blocking layer 80 is not formed, and FIG. 3 is a block diagram illustrating an operation of a display module 21.

Hereinafter, explanation will be made based on a first display module 21 which is one of the plurality of display modules 20, but other display modules 22, 23 among the plurality of display modules 20 may be constituted in the same configuration as the first display module 21.

The first display module 21 may include micro light-emitting diodes (LEDs) 50 and a substrate 70 wherein the micro LEDs 50 are disposed in the form of a grid, and a driver 60 driving each micro LED 50.

The micro LEDs 50 may consist of an inorganic light emitting substance of a size wherein the width, the length, and the height are equal to or smaller than 100 μm, and may be disposed on the substrate 70 and irradiate light by itself.

Also, the micro LEDs 50 may consist of one pixel 50', and in the one pixel, a red micro LED 51 emitting a red light, a green micro LED 52 emitting a green light, and a blue micro LED 53 emitting a blue light which are sub-pixels may be disposed.

The sub-pixels 51, 52, 53 may be disposed in the form of a matrix, or disposed sequentially in the one pixel 50'. However, such an arrangement form of the sub-pixels 51, 52, 53 is just an example, and the sub-pixels 51, 52, 53 may be disposed in various forms in each single pixel 50'.

In the disclosure, the sub-pixels and the micro LEDs 50 illustrated are regarded as the same components.

However, the micro LEDs 50 that will be described below are not limited to sub-pixel units, but they may mean one pixel unit.

That is, the opening S of the light blocking layer 80 that will be described below may not only be formed in a location corresponding to each sub-pixel, but it may also be formed in a corresponding location on one pixel.

The micro LEDs 50 have fast reaction speed, low power consumption, and high luminance, and thus they are gaining spotlight as light emitting diodes for the next generation displays. Specifically, the micro LEDs 50 have higher efficiency in converting electricity into photons compared to conventional liquid crystal displays (LCDs) or organic light-emitting diodes (OLEDs).

That is, compared to conventional LCD or OLED displays, the micro LEDs 50 have higher "brightness per watt." By virtue of this, the micro LEDs 50 may exert the same brightness even with energy as much as approximately half compared to conventional LEDs or OLEDs.

Other than the above, the micro LEDs 50 may implement a high resolution, and excellent colors, contrast, and brightness, and thus they may express colors in a wide range precisely, and may implement a clear screen even in the outdoors where sunlight is bright. Also, the micro LEDs 50 are strong against a burn in phenomenon, and emit little heat, and thus a long lifespan is guaranteed without deformation.

The substrate 70 may be electronically connected to each of the micro LEDs 50 mounted on the substrate 70 in the form of a matrix, and control the micro LEDs 50 through a driving signal of the driver 60.

The substrate 70 may be referred to as a general thin film transistor (TFT) substrate, but the name is not limited thereto.

Also, the substrate 70 may consist of various materials such as a flexible material, glass, and plastic.

The driver 60 may control each micro LED 50, and may be connected to the substrate 70 in the corner area of the substrate 70 or the rear surface of the substrate 70 by a chip on glass (COG) bonding or film on glass (FOG) bonding method.

However, a location wherein the driver 60 is disposed on the substrate 70 and a bonding method may vary, without being limited to the above.

Hereinafter, the detailed configuration of the light blocking layer 80 according to an embodiment of the disclosure will be described with reference to FIGS. 4 and 5.

Figure 4:
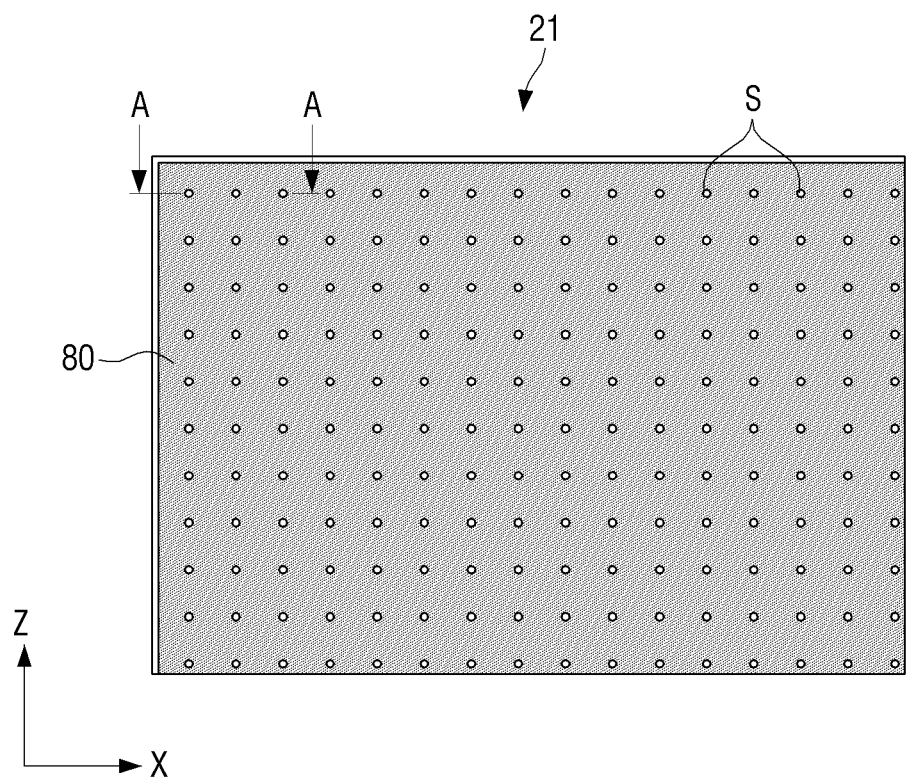
FIG. 4 is a front view illustrating a display module wherein a light blocking layer is formed according to an embodiment of the disclosure.
Figure 5:
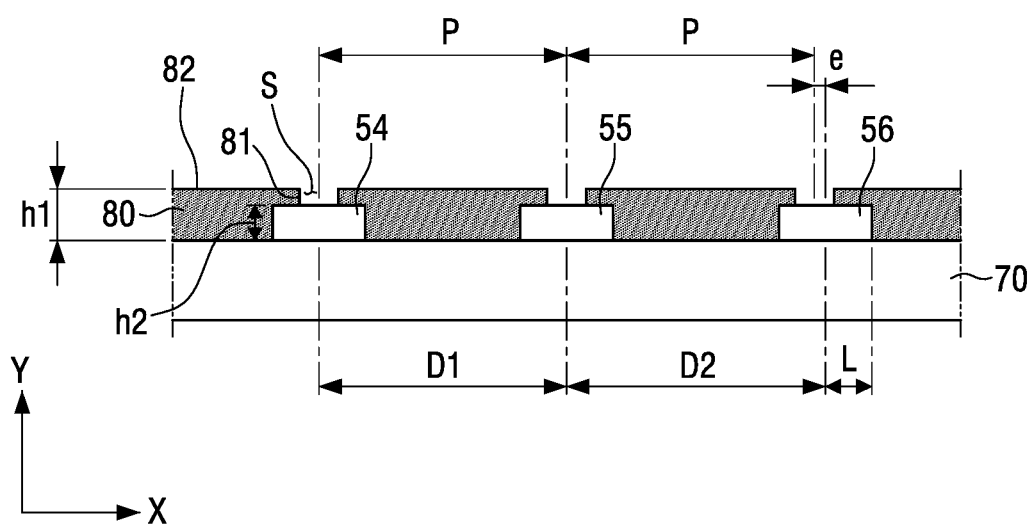
FIG. 5 is a sectional view illustrated along the A-A line in FIG. 4.

FIG. 4 is a front view illustrating a first display module 21 wherein a light blocking layer 80 is formed according to an embodiment of the disclosure, and FIG. 5 is a sectional view illustrated along the A-A line in FIG. 4.

The light blocking layer 80 may cover a plurality of micro LEDs 54, 55, 56, and fill the intervals among the plurality of micro LEDs 54, 55, 56.

Here, the plurality of micro LEDs 54, 55, 56 may include a first micro LED 54 emitting a red light, a second micro LED 55 emitting a green light, and a third micro LED 56 emitting a blue light, and the first through third micro LEDs 54, 55, 56 may constitute a pixel.

In addition, the first through third micro LEDs 54, 55, 56 may be sequentially disposed on the substrate 70.

The light blocking layer 80 may be formed while being coated on the substrate 70 wherein the plurality of micro LEDs 54, 55, 56 are disposed in the form of a grid.

Also, the light blocking layer 80 may consist of a black matrix photosensitive resin composition for liquid displays including a binder resin, a photopolymerization initiator, a black pigment, and a solvent, or a resin composition including a black pigment for shielding.

In addition, a resin composition including a black pigment may be applied on the substrate 70 through a dispenser 120 (refer to FIG. 10A) in a liquefied state, and form the light blocking layer 80.

The light blocking layer 80 may divide the intervals among the first through third micro LEDs 54, 55, 56 respectively emitting light in different colors, and thereby prevent mixing of each color, and absorb external light and thereby improve the contrast ratio.

In addition, the top surface 82 of the light blocking layer 80 may be formed to be flat. Accordingly, the light blocking layer 80 may not absorb or cover the side light of the light emitted from each micro LED 54, 55, 56, and may thereby enhance the luminance of the display screen.

Also, the height h1 of the light blocking layer 80 may be formed to be higher than the height h2 of the micro LEDs 54, 55, 56. Accordingly, the light blocking layer 80 may cover the micro LEDs 54, 55, 56 on the whole, including the top surfaces as well as the side surfaces of the micro LEDs 54, 55, 56.

In addition, the light blocking layer 80 may include a plurality of openings S formed such that the top surface of each of the plurality of micro LEDs 54, 55, 56 is exposed.

Accordingly, the light emitted from the top surfaces of the plurality of micro LEDs 54, 55, 56 may pass through the plurality of openings S, and may be emitted toward a top portion of the display module 21.

Here, the degree by which the top surface of each of the plurality of micro LEDs 54, 55, 56 is exposed may differ variously according to the sizes of the plurality of openings.

Also, the plurality of openings S may be formed at predetermined intervals P on the top portion (the Y axis direction) of each of the plurality of micro LEDs 54, 55, 56.

Here, the predetermined intervals P may be regular, and accordingly, light emitted from the plurality of micro LEDs 54, 55, 56 may be implemented on the display screen with uniform luminance through the plurality of openings S formed at the predetermined intervals P.

Specifically, the first micro LED 54 and the second micro LED 55 may be disposed at a first interval D1, and the second micro LED 55 and the third micro LED 56 may be disposed on the substrate 70 at a second interval D2 different from the first interval D1.

Here, due to the arrangement error of the second interval D2, the second interval D2 between the second micro LED 55 and the third micro LED 56 may become different from the first interval D1.

Accordingly, the distance among lights emitted from the first through third micro LEDs 54, 55, 56 may become irregular, and thus the luminance of the display screen may not be uniform.

In this case, the light blocking layer 80 formed on the first through third micro LEDs 54, 55, 56 may include a plurality of openings S formed at regular intervals, and the first through third micro LEDs 54, 55, 56 corresponding to each of the plurality of openings S may emit lights while maintaining regular intervals among lights through the plurality of openings S.

For reference, intervals among the plurality of openings S may mean the distance from the center portion of one opening to the center portion of the closest opening. Also, intervals among the micro LEDs may mean the distance from the center portion of one micro LED to the center portion of the closest micro LED.

Specifically, in case the center axis of the second micro LED 55 and the center axis of an opening S formed on the top portion of the second micro LED 55 coincide, the difference value e (i.e., an arrangement error) between the second interval (which is the interval between the second micro LED 55 and the third micro LED 56) and the interval P (between the opening S formed on the top portion of the second micro LED 55 and the opening S formed on the top portion of the third micro LED 56) may be smaller than length L, which may be, for example, half the length of a micro LED in the axial direction of the micro LEDs.

Accordingly, one opening S may be formed on one micro LED in one to one correspondence, and a plurality of openings S may be made to irradiate light emitted from each micro LED 54, 55, 56 to the top portion of the first display module 21.

In addition, the plurality of openings S may be formed in the form of a grid, and each of the plurality of openings may be formed in a location corresponding to each of the plurality of micro LEDs 54, 55, 56.

For example, on the top portion of the first micro LED 54, one opening S may be formed, and on the top portion of the second micro LED 55, one opening S may also be formed.

Also, the cross sections of the plurality of openings S may be circles of which diameters are regular. Specifically, the plurality of openings S may include side surfaces 81 that are formed to be approximately vertical with respect to the top surface of each micro LED 54, 55, 56.

Accordingly, light emitted from one micro LED may be emitted uniformly in a radial direction, and may implement uniform luminance of the display screen.

In addition, the cross sectional area of each of the plurality of openings S may be smaller than the cross sectional areas of the top surfaces of the plurality of micro LEDs 54, 55, 56.

Accordingly, even if the plurality of openings S are formed on the top surfaces of the plurality of micro LEDs 54, 55, 56, the plurality of openings S may be located within a cross-section of the top surfaces of the micro LEDs 54, 55, 56.

Hereinafter, the configuration of a modified embodiment of the first display module 21' will be described with reference to FIG. 6.

Figure 6:
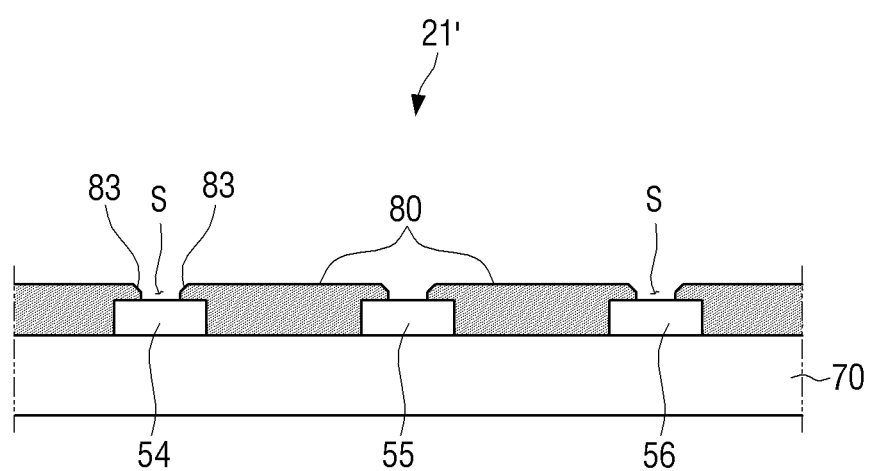
FIG. 6 is a sectional view illustrating a modified embodiment of a display module.

FIG. 6 is a sectional view illustrating a modified embodiment of the first display module 21'.

The plurality of micro LEDs 54, 55, 56, the substrate 70, and the light blocking layer 80 illustrated in FIG. 6 are the same components as described earlier, and thus they are identical to the aforementioned components.

Each of the plurality of openings S may include a light diffusing surface 83 which is formed to be tilted by a specific angle with respect to the top surfaces of the micro LEDs 54, 55, 56 along the corner of each of the plurality of openings S.

The light diffusing surface 83 may be formed through an additional process after the light blocking layer 80 is formed, or may be formed simultaneously when the opening S of the light blocking layer 80 is formed.

The light diffusing surface 83 may not cover the side light when light emitted from the top surfaces of the plurality of micro LEDs 54, 55, 56 is diffused. Accordingly, the light diffusing surface 83 may improve the luminance of the display screen.

Hereinafter, the configuration of another modified embodiment of the first display module 21" will be described with reference to FIG. 7.

Figure 7:
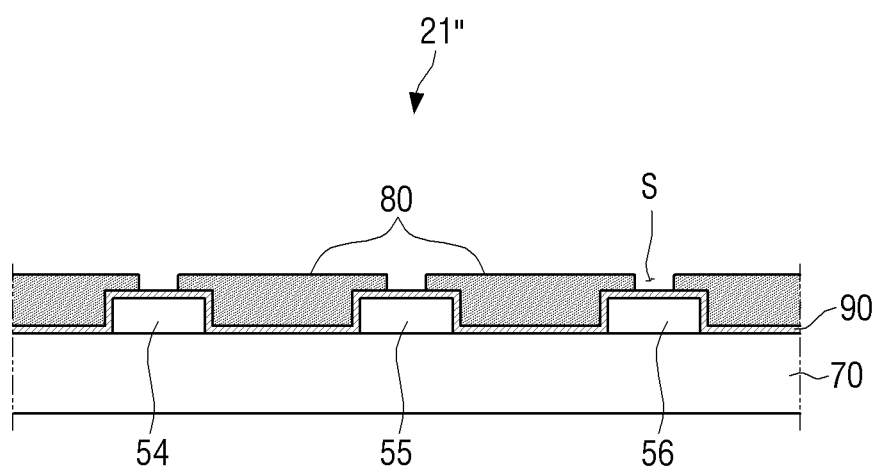
FIG. 7 is a sectional view illustrating another modified embodiment of a display module.

FIG. 7 is a sectional view illustrating another modified embodiment of the first display module 21".

The plurality of micro LEDs 54, 55, 56, the substrate 70, and the light blocking layer 80 illustrated in FIG. 7 are the same components as described earlier, and thus they are identical to the aforementioned components.

The first display module 21" may further include a substrate 70 and a protective layer 90 formed on the top portions of the plurality of micro LEDs 54, 55, 56 disposed on the substrate 70.

The protective layer 90 may prevent the micro LEDs 54, 55, 56 from being damaged in the process wherein the plurality of openings S are formed in the light blocking layer 80.

Also, the protective layer 90 may consist of a material that has a permeation rate over a certain level, such that light emitted from the micro LEDs 54, 55, 56 can permeate.

In addition, the protective layer 90 is formed to be applied integrally on the substrate 70 wherein the micro LEDs 54, 55, 56 are disposed, and thus the locations of the micro LEDs 54, 55, 56 on the substrate 70 may be fixed stably.

Hereinafter, the configuration of the light blocking layer 80 in case a plurality of display modules 21, 22 are disposed will be described with reference to FIGS. 8A to 8C.

Figure 8A:
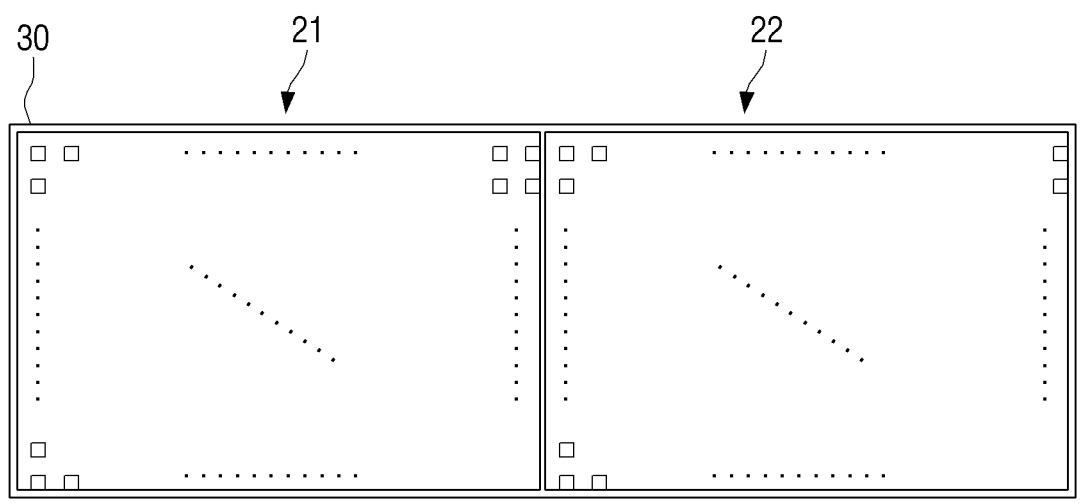
FIG. 8A is a front view illustrating a state wherein a plurality of display modules are disposed.
Figure 8B:
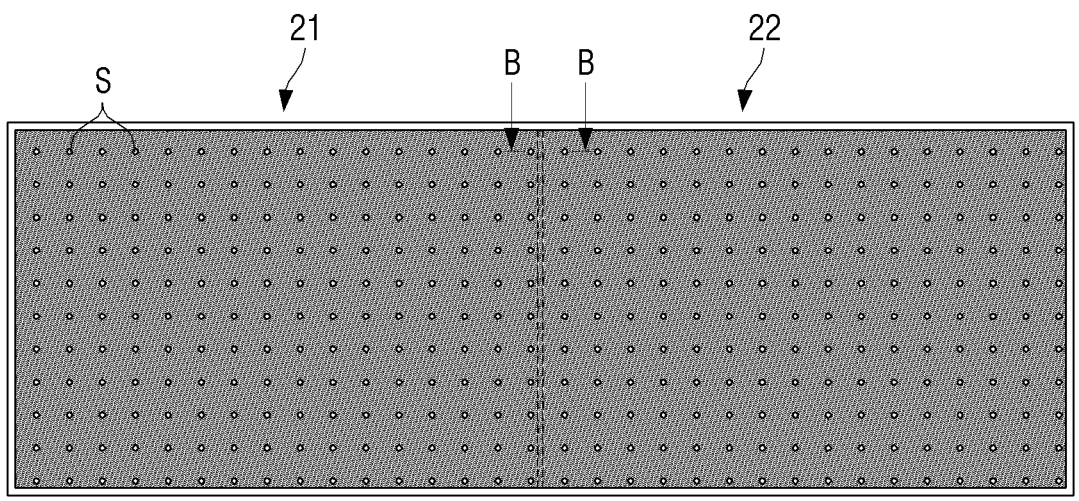
FIG. 8B is a front view illustrating a plurality of display modules wherein a light blocking layer is formed according to an embodiment of the disclosure.
Figure 8C:
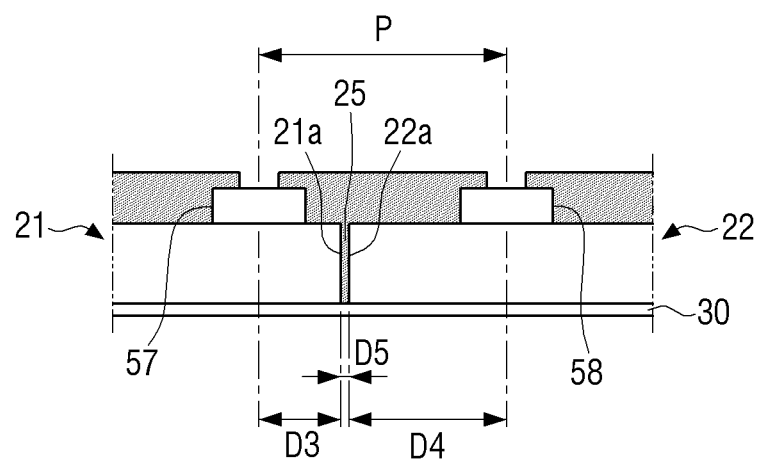
FIG. 8C is a sectional view illustrated along the B-B line in FIG. 8B.

FIG. 8A is a front view illustrating a state wherein a plurality of display modules 21, 22 are disposed, FIG. 8B is a front view illustrating a plurality of display modules 21, 22 wherein a light blocking layer 80 is formed according to an embodiment of the disclosure, and FIG. 8C is a sectional view illustrated along the B-B line in FIG. 8B.

As illustrated in FIG. 8A, the first and the second display modules 21, 22 may be manufactured in the form of a module having a specific size, and the first and the second display modules 21, 22 may be disposed on an arrangement member 30 and implement display screens in various sizes and forms.

Afterwards, as illustrated in FIG. 8B, on the top surfaces of the first and the second display modules 21, 22 disposed on the arrangement member 30 and the arrangement member 30, a light blocking layer 80 may be formed.

Specifically, the first and the second display modules 21, 22 may be disposed on the arrangement member 30 while having an interval D5 in a micro unit, for preventing damage due to contact between the first and the second display modules 21, 22.

Here, the light blocking layer 80 may be formed integrally on the top portions of the arrangement member 30 and the first and the second display modules 21, 22 disposed on the arrangement member 30, so as to fill the interval D5 between the first and the second display modules 21, 22.

That is, the light blocking layer 80 formed on the top portion of each of the plurality of display modules 21, 22 may be formed integrally.

Accordingly, a portion corresponding to a seam that can be seen on the display screen due to the interval D5 between the first and the second display modules 21, 22 is filled or covered by the light blocking layer 80, and thus seams on the display screen are covered, and a seamless screen can thereby be implemented.

In addition, on the light blocking layer 80, a plurality of openings S may be formed at predetermined intervals correspondingly to the locations wherein the micro LEDs disposed on each display module 21, 22 are located.

Here, the interval between the fourth micro LED 57 located in the corner of the first display module 21 and the fifth micro LED 58 located in the corner of the second display module 22 may be the sum of the third interval D3 which is the distance between the side surface 21a of the first display module 21 and the fourth micro LED 57, the fourth interval D4 which is the distance between the side surface 22a of the second display module 22 and the fifth micro LED 58, and the interval D5 between the plurality of display modules 21, 22.

Accordingly, the interval between the fourth and the fifth micro LEDs 57, 58 has a configuration that has an increased spacing due to the interval D5 between the plurality of display modules 21, 22. However, on the light blocking layer 80, a plurality of openings S may be formed at predetermined intervals P, and thus light may be emitted at predetermined intervals despite the interval D5 between the plurality of display modules 21, 22, and accordingly, the luminance of the display screen can be implemented uniformly.

Hereinafter, a process wherein a display module 20 is formed will be described in detail with reference to FIGS. 9 to 14.

Figure 9:
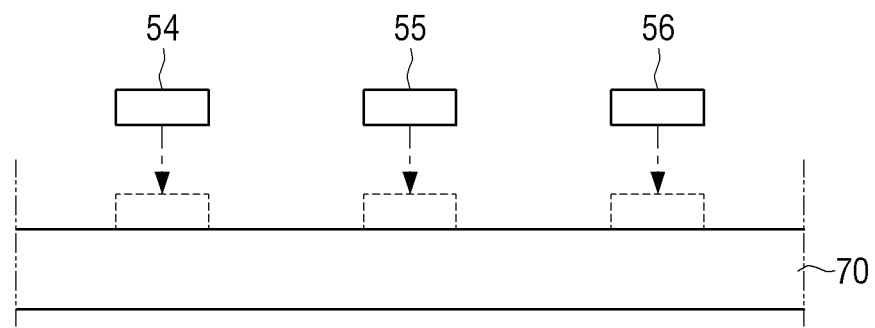
FIG. 9 is a schematic sectional view illustrating a process wherein a plurality of micro LEDs are disposed on a substrate.
Figure 10A:
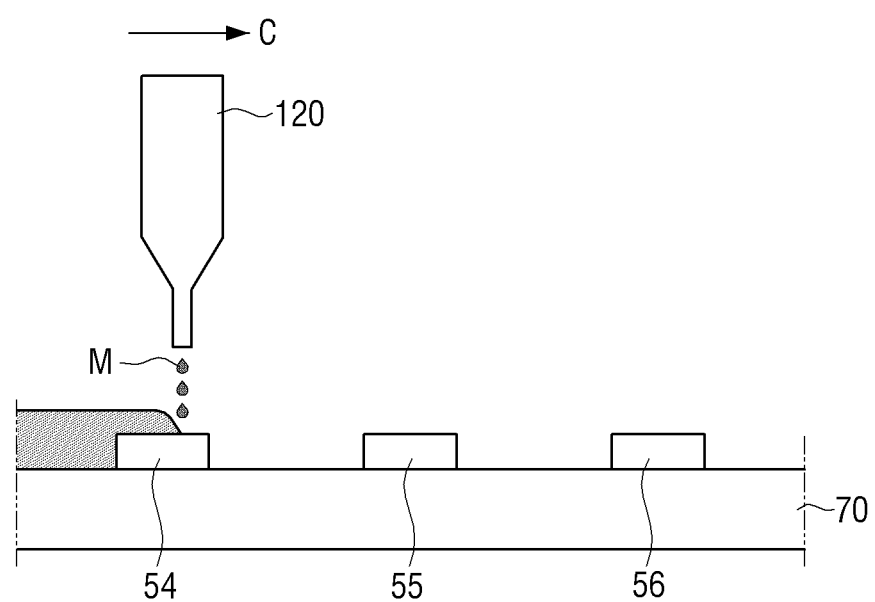
FIG. 10A is a schematic sectional view illustrating a process of applying a light blocking layer by using a dispenser.
Figure 10B:
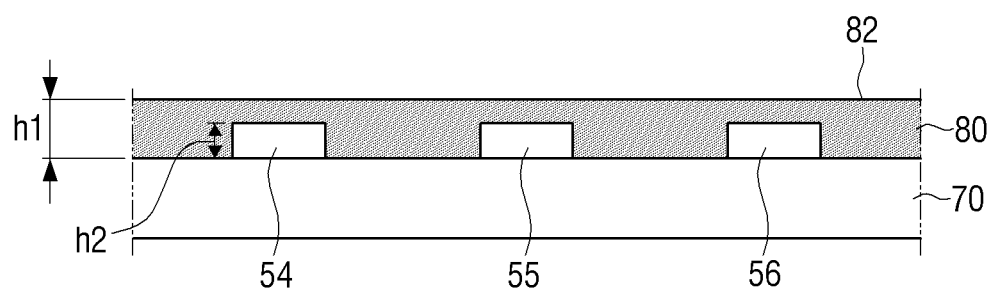
FIG. 10B is a schematic sectional view illustrating formation of a light blocking layer on a plurality of micro LEDs and a substrate.
Figure 11:
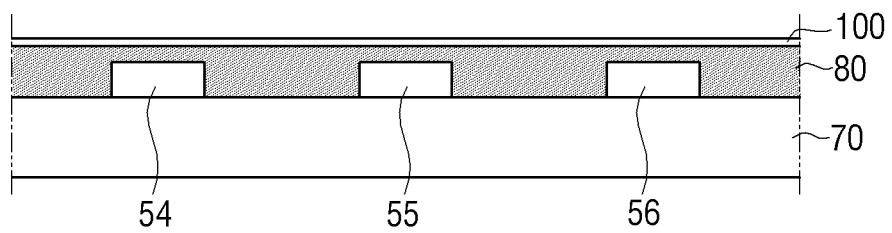
FIG. 11 is a schematic sectional view illustrating formation of a photo resist layer on a top surface of a light blocking layer.
Figure 12:
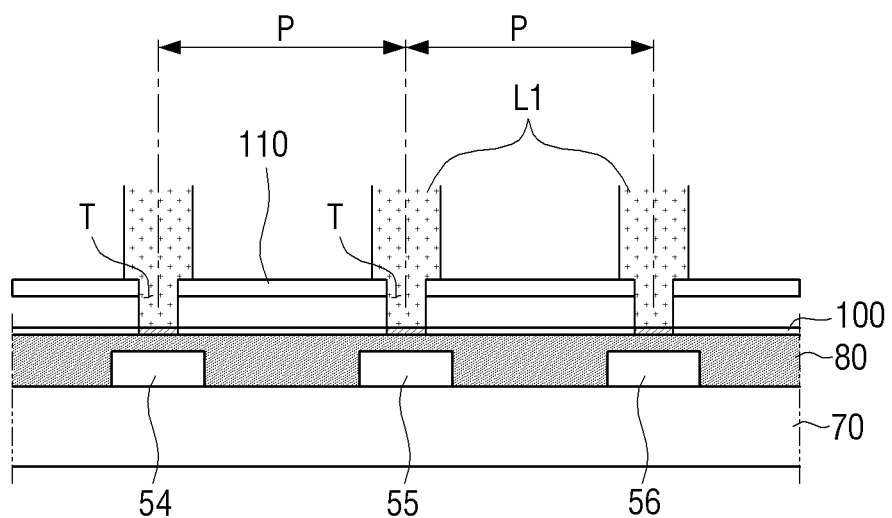
FIG. 12 is a schematic sectional view illustrating a process of forming a plurality of openings on a light blocking layer.
Figure 13:
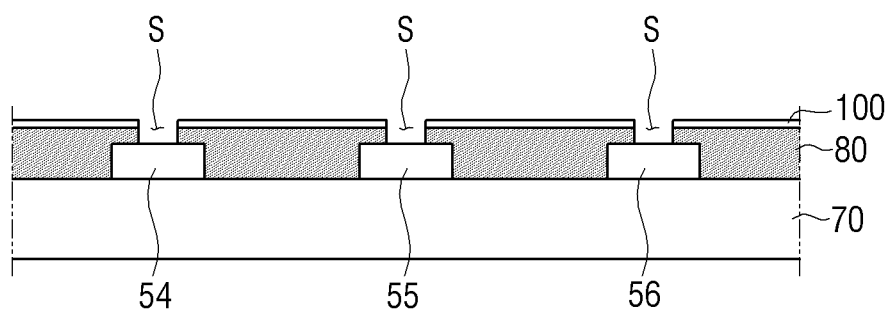
FIG. 13 is a schematic sectional view illustrating formation of a plurality of openings on a photo resist layer and a light blocking layer.
Figure 14:
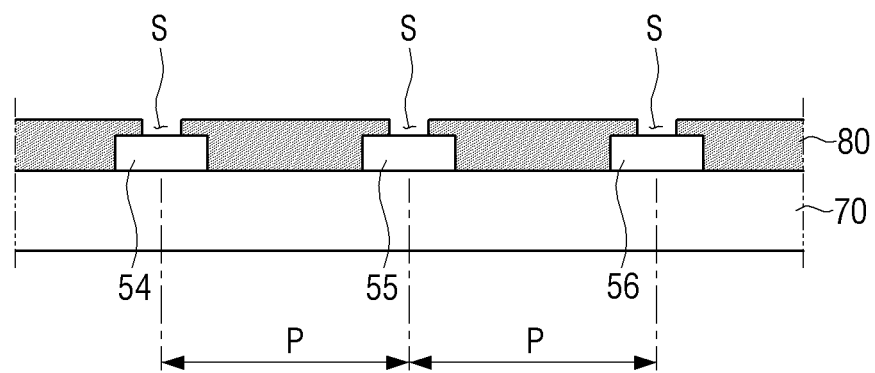
FIG. 14 is a sectional view illustrating a display module wherein a plurality of openings are formed.

FIG. 9 is a schematic sectional view illustrating a process wherein a plurality of micro LEDs 54, 55, 56 are disposed on a substrate 70. FIG. 10A is a schematic sectional view illustrating a process of applying a light blocking layer by using a dispenser. FIG. 10B is a schematic sectional view illustrating formation of a light blocking layer 80 on a plurality of micro LEDs 54, 55, 56 and a substrate 70. FIG. 11 is a schematic sectional view illustrating formation of a photo resist layer 100 on a top surface of a light blocking layer 80. FIG. 12 is a schematic sectional view illustrating a process of forming a plurality of openings S on a light blocking layer 80. FIG. 13 is a schematic sectional view illustrating formation of a plurality of openings S on a photo resist layer 100 and a light blocking layer 80. FIG. 14 is a sectional view illustrating a display module 20 wherein a plurality of openings S are formed.

First, the first through third micro LEDs 54, 55, 56 are disposed at predetermined intervals on the substrate 70.

Here, it was illustrated that the first through third micro LEDs 54, 55, 56 correspond to sub-pixels emitting red, green, and blue lights, respectively. However, the micro LEDs are not limited thereto, and they may be one pixel 50' including sub-pixels emitting red, green, and blue lights.

Afterwards, as illustrated in FIG. 10A, a resin composition M in a liquefied state including a black pigment may be applied on the substrate 70 through a dispenser 120.

Specifically, the dispenser 120 including the resin composition M in a liquefied state including a black pigment may move in a predetermined direction C on the substrate 70 while applying the resin composition at the height h1 of the light blocking layer to be implemented.

Next, the resin composition M in a liquefied state including a black pigment applied on the substrate 70 in a liquefied state may be solidified, and a solidified light blocking layer 80 may be formed.

Accordingly, as illustrated in FIG. 10B, the light blocking layer 80 may be applied on the plurality of disposed micro LEDs 54, 55, 56 and the substrate 70 wherein the plurality of micro LEDs 54, 55, 56 are disposed.

Here, the height h1 of the light blocking layer 80 may be higher than the height h2 of the plurality of micro LEDs 54, 55, 56, so as to cover the plurality of micro LEDs 54, 55, 56.

In addition, the top surface 82 of the light blocking layer 80 may be formed to be flat, and a separate process of making the light blocking layer 80 flat may be included.

Also, before the light blocking layer 80 is applied, a protective layer 90 (refer to FIG. 7) may be formed on the top surfaces of the plurality of micro LEDs 54, 55, 56.

Next, as illustrated in FIG. 11, a photo resist layer 100 may be applied on the top surface of the applied light blocking layer 80.

The photo resist layer 100 consists of a source material that causes a chemical change when light is irradiated.

Afterwards, as illustrated in FIG. 12, a mask 110 wherein a through hole T is formed in the form of a grid may be located on the top portion of the photo resist layer 100, and light U may be exposed on the top portion of the mask 110.

Here, the through hole T may be formed variously according to the shape of the opening S to be formed on the light blocking layer 80, and according to the intervals and the patterns of a plurality of openings S to be formed, the intervals and the patterns of a plurality of through holes T on the mask 110 may vary.

In addition, the light U may be ultraviolet rays.

Accordingly, the property of a portion of the photo resist layer 100 exposed to the light U changes through a chemical change.

Afterwards, the area wherein a plurality of openings S will be formed may be etched, and the plurality of openings S may be formed on the plurality of micro LEDs 54, 55, 56 as in FIG. 13.

Here, etching of the plurality of openings S may be performed by various methods, without being limited to a dry method or a wet method.

Lastly, the photo resist layer 100 remaining on the top portion of the light blocking layer 80 may be removed, and a display module 20 as illustrated in FIG. 14 may thereby be manufactured.

Also, in case the plurality of display modules 20 constitute a display screen, a step of disposing the plurality of display modules 20 on the arrangement member 30 may be further included.

Here, the plurality of display modules 20 may be disposed in parallel with one another on the same plane, so that a difference in height among the plurality of display modules 20 will not occur.

Afterwards, in a state wherein the plurality of display modules 20 are disposed on the arrangement member 30, the light blocking layer 80 may be applied on the plurality of display modules 20 and the arrangement member 30.

Accordingly, the light blocking layer 80 may not only cover the top surfaces of the plurality of display modules 20, but also fill the interval D5 among the plurality of display modules 20.

Accordingly, the light blocking layer 80 may remove a seam that occurs due to the interval D5 among the plurality of display modules 20, and may thereby implement a seamless screen, and may also fix the plurality of display modules 20 on the arrangement member 30 stably.

So far, non-limiting example embodiments of the disclosure were explained separately, but each embodiment does not necessarily have to be implemented individually, and the configuration and the operation of each embodiment may be implemented by being combined with at least one other embodiment.

Also, while non-limiting example embodiments of the disclosure have been shown and described so far, the disclosure is not limited to the aforementioned specific embodiments, and it is apparent that various modifications can be made by those having ordinary skill in the art to which the disclosure belongs, without departing from the gist of the disclosure as claimed by the appended claims. Also, it is intended that such modifications are not to be interpreted independently from the technical idea or prospect of the disclosure.

What is claimed is:

1. A display module comprising:
a substrate;
a plurality of light emitting diodes (LEDs) that are disposed on the substrate and irradiate light, the plurality of LEDs comprising a first LED, a second LED, and a third LED; and
a light blocking layer that covers the plurality of LEDs, and fills intervals among the plurality of LEDs, each interval of the intervals being a distance between centers of two adjacent LEDs of the plurality of LEDs, and
wherein the light blocking layer includes a plurality of openings formed such that a top surface of each of the plurality of LEDs is exposed through a respective one of the plurality of openings,
wherein first intervals between centers of adjacent openings of the plurality of openings are identical,
wherein the second LED is adjacent to and between the first LED and the third LED, and
wherein a second interval between a center of the first LED and a center of the second LED is equal to the first intervals and is different from a third interval between the center of the second LED and a center of the third LED, such that the center of the first LED and the center of the second LED are centered within respective ones of the plurality of openings while the center of the third LED is off-center with respect to one of the plurality of openings from which the top surface of the third LED is exposed.

2. The display module of claim 1,
wherein a cross section of each of the plurality of openings is smaller than a cross section of the top surface of each of the plurality of LEDs.

3. The display module of claim 2,
wherein the cross sections of the plurality of openings are circles of which diameters are regular.

4. The display module of claim 1,
wherein the light blocking layer includes a plurality of light diffusing surfaces, and
along a corner of each opening of the plurality of openings is provided a respective light diffusing surface, of the plurality of light diffusing surfaces, which is tilted at a specific angle with respect to the top surfaces of the plurality of LEDs.

5. The display module of claim 1, wherein the first through third LEDs together constitute a pixel, and the first through third LEDs are each a respective one from among:
a first micro LED configured to emit a red light;
a second micro LED configured to emit a green light; and
a third micro LED configured to emit a blue light.

6. The display module of claim 5, wherein the first through third micro LEDs are sequentially disposed on the substrate.

7. The display module of claim 1,
wherein the light blocking layer is formed on the substrate, and
a height of the light blocking layer is higher than a height of the plurality of LEDs.

8. The display module of claim 1, wherein each of the plurality of LEDs is a pixel that comprises three sub-pixels, and
wherein, for each LED from among the plurality of LEDs, top surfaces of the sub-pixels of the LED are together exposed through a respective one of the plurality of openings.

9. A display apparatus comprising:
a plurality of display modules;
an arrangement member that supports the plurality of display modules to be disposed in parallel on a same plane; and
a housing that supports the plurality of display modules and the arrangement member,
wherein each of the plurality of display modules includes:
a substrate;
a plurality of light emitting diodes (LEDs) that are disposed on the substrate and irradiate light, the plurality of LEDs comprising a first LED, a second LED, and a third LED; and
a light blocking layer that covers the plurality of LEDs, and fills intervals among the plurality of LEDs, each interval of the intervals being a distance between centers of two adjacent LEDs of the plurality of LEDs,
wherein the light blocking layer includes a plurality of openings formed such that a top surface of each of the plurality of LEDs is exposed through a respective one of the plurality of openings,
wherein first intervals between centers of adjacent openings of the plurality of openings are identical,
wherein the second LED is adjacent to and between the first LED and the third LED, and
wherein, for at least one of the plurality of display modules, a second interval between a center of the first LED and a center of the second LED is equal to the first intervals and is different from a third interval between the center of the second LED and a center of the third LED, such that the center of the first LED and the center of the second LED are centered within respective ones of the plurality of openings while the center of the third LED is off-center with respect to one of the plurality of openings from which the top surface of the third LED is exposed.

10. The display apparatus of claim 9,
wherein the light blocking layer of a first display module of the plurality of display modules is formed with the light blocking layer of a second display module of the plurality of display modules, as a combined light blocking layer,
the first display module is adjacent to the second display module with a fourth interval between an edge of the first display module and an edge of the second display module, and
the combined light blocking layer fills the fourth interval between the edge of the first display module and the edge of the second display module.

11. The display apparatus of claim 10,
wherein each light blocking layer of the plurality of display modules is formed together as an integrated body, and the integrated body is formed in a top portion of the plurality of display modules.

12. The display apparatus of claim 9,
wherein cross sections of the plurality of openings are circles of which diameters are regular.

13. The display apparatus of claim 9,
wherein, for each display module of the plurality of display modules:
each of the plurality of LEDs of the display module is a pixel that comprises three sub-pixels, and
for each LED from among the plurality of LEDs, top surfaces of the three sub-pixels of the LED are together exposed through a respective one of the plurality of openings of the light blocking layer of the display module.

14. The display apparatus of claim 10, wherein an opening of the plurality of openings of the first display module is adjacent to an opening of the plurality of openings of the second display module, and
a fifth interval between a center of the opening of the first display module and a center of the opening of the second display module is a same distance as the first intervals between the centers of the adjacent openings of the plurality of openings of the first display module and the first intervals between the centers of the adjacent openings of the plurality of openings of the second display module.

15. A method of manufacturing a display module comprising:
disposing a plurality of light emitting diodes (LEDs) on a substrate, the plurality of LEDs including a first LED, a second LED, and a third LED;
applying a light blocking layer on the plurality of LEDs that are disposed, and the light blocking layer filling intervals among the plurality of LEDs, each interval of the intervals being a distance between centers of two adjacent LEDs of the plurality of LEDs; and
forming a plurality of openings that each expose a top surface of a respective one of the plurality of LEDs,
wherein first intervals between centers of adjacent openings of the plurality of openings are identical,
wherein the second LED is adjacent to and between the first LED and the third LED, and
wherein a second interval between a center of the first LED and a center of the second LED is equal to the first intervals and is different from a third interval between the center of the second LED and a center of the third LED, such that the center of the first LED and the center of the second LED are centered within respective ones of the plurality of openings while the center of the third LED is off-center with respect to one of the plurality of openings from which the top surface of the third LED is exposed.

16. The method of manufacturing a display module of claim 15,
wherein the forming the plurality of openings further comprises:
applying a photo resist layer on a top surface of the light blocking layer that is applied;
positioning a mask wherein through holes of the mask are formed in the form of a grid on a top portion of the photo resist layer;
exposing light to the top portion of the mask;
etching an area wherein the plurality of openings will be formed; and
removing the photo resist layer.

17. The method of manufacturing a display module of claim 15, further comprising:
applying a protective layer on the top surfaces of the plurality of LEDs before applying the light blocking layer.

18. The method of manufacturing a display module of claim 15,
wherein the applying the light blocking layer comprises:
applying, by using a dispenser, a resin composition constituting the light blocking layer and including a black pigment.

* * * * *